United States Patent
Sawamoto

(10) Patent No.: US 6,426,566 B1
(45) Date of Patent: Jul. 30, 2002

(54) ANISOTROPIC CONDUCTOR FILM, SEMICONDUCTOR CHIP, AND METHOD OF PACKAGING

(75) Inventor: Toshihiro Sawamoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/601,033

(22) PCT Filed: Dec. 2, 1999

(86) PCT No.: PCT/JP99/06795

§ 371 (c)(1),
(2), (4) Date: Jul. 26, 2000

(87) PCT Pub. No.: WO00/33375

PCT Pub. Date: Jun. 8, 2000

(30) Foreign Application Priority Data

Dec. 2, 1998 (JP) .............................. 10-343081

(51) Int. Cl.⁷ .................... H01L 23/48; H01L 23/52; H01L 29/40
(52) U.S. Cl. .................. 257/783; 257/787; 257/788; 257/789; 257/790
(58) Field of Search ................. 257/783, 737, 257/787, 788–790; 438/112, 124, 127

(56) References Cited

U.S. PATENT DOCUMENTS

| | | | |
|---|---|---|---|
| 5,120,665 A | * | 6/1992 | Tsukagoshi et al. ........ 438/613 |
| 5,949,142 A | * | 9/1999 | Otsuka ........................ 257/737 |
| 6,223,429 B1 | * | 5/2001 | Kaneda et al. ................ 29/832 |

FOREIGN PATENT DOCUMENTS

| | | | |
|---|---|---|---|
| JP | A-10-125725 | | 5/1998 |
| JP | A-11-135567 | | 5/1999 |
| JP | 11-306861 | * | 11/1999 |

* cited by examiner

*Primary Examiner*—Jasmine J. B. Clark
(74) *Attorney, Agent, or Firm*—Oliff & Berridge, PLC

(57) ABSTRACT

An anisotropic conductive film 3 bonds the semiconductor chip 1 to the substrate 2 while serving as an electrically conductive medium therebetween. The anisotropic conductive film 3 is produced by laminating, in a unitary body, an electrically conductive particle containing layer 31 constructed of a mixture of electrically conductive particles and a resin, and an electrically non-conductive layer 32 having a fluidity lower than the fluidity of the electrically conductive particle containing layer.

12 Claims, 7 Drawing Sheets

ANISOTROPIC CONDUCTOR FILM, SEMICONDUCTOR CHIP, AND METHOD OF PACKAGING

BACKGROUND OF THE INVENTION

1. Field of the Invention

The present invention relates to an anisotropic conductive film, a method for mounting a semiconductor chip, and a semiconductor device, and more particularly, to an anisotropic conductive film which appropriately mounts a semiconductor chip to a substrate with an active element formation surface of the chip facing the substrate, a method for mounting a semiconductor chip, and a semiconductor device.

2. Description of Related Art

Anisotropic conductive films are typically employed for so-called flipchip mounting, in which a semiconductor chip is mounted with the surface thereof bearing electrodes looking downward. An anisotropic conductive adhesive is formed in a sheet, and is called ACF (anisotropic conductive film). The thickness of the ACF is 50 μm approximately. The ACF has an elongated tape-like configuration, and before use, a cover film remains attached on both sides of the ACF.

The ACF is typically produced by applying electrically conductive particles, such as epoxy resin particles plated with a metal such as Ni or Au, to an epoxy-based or polyurethane-based thermosetting resin. Also occasionally in use are metal-coated resin particles which are further coated with a resin. In such a case, when the resin particles are in contact with each other or in contact with a bump of a semiconductor chip, the surface resin coatings are destroyed, assuring electrical conduction therebetween.

A typical mounting method of a semiconductor chip employing a conventional anisotropic conductive film is now discussed. FIGS. 8(A) and 8(B) are cross-sectional views showing a semiconductor chip using a conventional anisotropic conductive film. FIG. 8(A) is the cross-sectional view showing the semiconductor chip that is thermo-compression bonded through the conventional anisotropic conductive film, and FIG. 8(B) is the cross-sectional view showing the semiconductor chip that is mounted on a warped substrate using a conventional anisotropic conductive film. Referring to FIG. 8(A), the anisotropic conductive film 3 is glued onto the substrate 2 having a wiring pattern 21 thereon. The semiconductor chip 1 is mounted on the anisotropic conductive film 3 with bumps 11 formed on electrodes of the semiconductor chip 1 facing the wiring pattern 21. Using a thermo-compression tool 51, the semiconductor chip 1 is heated from the surface thereof opposite to the surface bearing the bumps 11 while being pressed in the direction of an arrow A.

When heated, the anisotropic conductive film 3 gains fluidity, filling the space surrounding the bump 11 and the wiring pattern 21, and furthermore flows out of bonding surfaces between the semiconductor chip 1 and the substrate 2, and clings to the sides of the semiconductor chip 1. Some of electrically conductive particles 36 are clamped between the bump 11 and the wiring pattern 21.

After the thermo-compression process, when the setting of the anisotropic conductive film 3 is completed, the semiconductor chip 1 and the substrate 2 are bonded through the anisotropic conductive film 3. The anisotropic conductive film 3 clinging to the sides of the semiconductor chip 1 forms a fillet 34, reinforcing the mechanical bond between the semiconductor chip 1 and the substrate 2. The electrically conductive particles 36 clamped between the bump 11 and the wiring pattern 21 serve as an electrically conductive medium.

SUMMARY OF THE INVENTION

The above-referenced conventional art suffers from the following drawback.

When the fluidity of the anisotropic conductive film 3 is relatively large, the anisotropic conductive film 3 easily flows and clings not only to the sides of the semiconductor chip 1 but also to the thermo-compression tool 51, as represented by a deposit 35 as shown in FIG. 8(A), when the semiconductor chip 1 is heated and pressed by the thermo-compression tool 51. The management of the steps involved in the thermo-compression process of the semiconductor chip increases if part of the anisotropic conductive film 3 frequently clings to the thermo-compression tool 51, the thermo-compression tool 51 frequently needs cleaning.

When the fluidity of the anisotropic conductive film 3 is small, the anisotropic conductive film 3 tends to remain between the bump 11 and the wiring pattern 21 when the semiconductor chip 1 is heated and pressed by the thermo-compression tool 51. There occurs a variation in connection resistance of the bumps 11. Particularly when the substrate 2 has a warp, the anisotropic conductive film and the substrate fail to properly join each other, and some of the bumps 11 and the wiring pattern 21 suffer from a point contact as represented by a point contact area 39. In extreme cases, no electrical connection is established between the bump 11 and the wiring pattern 21.

The present invention resolves the above conventional problems. It is an object of the present invention to provide an anisotropic conductive film which reliably assures electrical connection between a substrate and a semiconductor chip and prevents the anisotropic conductive film from clinging to a thermo-compression tool, thereby permitting manufacturing steps to be easily managed.

It is another object of the present invention to provide a semiconductor device incorporating the anisotropic conductive film.

To achieve the above objects, as recited in accordance with one exemplary embodiment of the present invention, an anisotropic conductive film of the present invention, which bonds a semiconductor chip to a substrate while serving as an electrically conductive medium between the semiconductor chip and the substrate, includes in lamination a first layer including at least one layer structure having electrically conductive particles, and a second layer including at least one layer structure having a fluidity higher than the fluidity of the first layer.

When heated, the anisotropic conductive film of claim 1, as constructed, creates a different fluidity between the first layer and the second layer. With the first layer less fluid and thus higher in hardness, the anisotropic conductive film is prevented from flowing out from between the semiconductor chip and the substrate when the semiconductor chip is bonded to the substrate by thermo-compression. The number of electrically conductive particles interposed between the electrodes of the semiconductor chip and the electrodes of the substrate is thus increased. On the other hand, with the second layer being more fluid and softer than the first layer, the anisotropic conductive film easily flows outward from between the semiconductor chip and the substrate when the semiconductor chip is bonded by thermo-compression to the substrate. This arrangement forms the fillet clinging to the sides of the semiconductor chip without impeding the contact between the chip electrodes and the substrate electrodes.

Compared to the amount of resin flowing out in the conventional anisotropic conductive film, the amount of resin flowing out from between the semiconductor chip and the substrate is reduced. This arrangement prevents the anisotropic conductive film from clinging to the thermocompression tool. As a result, the mechanical bond between the semiconductor chip and the substrate is securely maintained while the reliability of the electrical connection therebetween is increased. The management of the bonding step of the semiconductor chip to the substrate is simplified.

In order to reduce the amount of the anisotropic conductive film clinging to the sides of the semiconductor chip, the thickness of the above anisotropic conductive film is preferably equal to the thickness of the conventional film. If the density of the electrically conductive particles contained in the electrically conductive particle containing layer is equal to that of the conventional anisotropic conductive film, the number of the electrically conductive particles per unit volume will be smaller than that in the conventional anisotropic conductive film. The conductivity between the semiconductor chip and the substrate decreases. The density of the electrically conductive particles is preferably slightly higher than that in the conventional anisotropic conductive film.

In an anisotropic conductive film in accordance with a secondary exemplary embodiment of the present invention, the second layer is formed over first layer.

In the anisotropic conductive film in accordance with the above exemplary embodiment, the second layer is interposed between the first layer and both the active-element formation surface of the semiconductor chip and the wiring pattern formation surface of the substrate. This arrangement reduces the occurrence of direct contact of the electrically conductive particles contained in the first layer to the area of the semiconductor chip having no bumps formed in the active-element formation surface thereof and to the area of the substrate having no wiring pattern formed in the wiring pattern formation surface thereof. Even if metallic particles having sharp irregularities, such as nickel particles as the electrically conductive particles, are employed, the possibility of damaging the active-element formation surface and the wiring pattern formation surface is reduced. As a result, the candidate material range of the electrically conductive particles is expanded.

With two second layers respectively placed into contact with the substrate and the semiconductor chip, the more fluid second layers flows compliantly along the irregularities and warps of the active-element formation surface and the wiring pattern formation surface, thereby allowing the anisotropic conductive film, the semiconductor chip, and the substrate to tightly bond to each other. As a result, the mechanical bond between the semiconductor chip and the substrate is securely maintained while the reliability of the electrical connection therebetween is increased.

In an anisotropic conductive film in accordance with a third exemplary embodiment of the present invention, the first layer is interposed between the two second layers.

In the anisotropic conductive film constructed as recited in accordance with the above exemplary embodiment, the second layers are respectively interposed between the first layer and the active-element formation surface of the semiconductor chip and between the first layer and the wiring formation surface of the substrate. This arrangement reduces the occurrence of direct contact of the electrically conductive particles contained in the first layer to the area of the semiconductor chip having no bumps formed in the active-element formation surface and to the area of the substrate having no wiring pattern formed in the wiring pattern formation surface. Even if metallic particles having sharp irregularities, such as nickel particles as the electrically conductive particles, are employed, the possibility of damaging the active-element formation surface and the wiring pattern formation surface is reduced. As a result, the candidate material range of the electrically conductive particles is expanded.

In an anisotropic conductive film in accordance with a fourth exemplary embodiment of the present invention, the first layer is thicker than the second layer.

The anisotropic conductive film in accordance with the above exemplary embodiment keeps the electrically conductive particles contained in the first layer separated from each other by proper spacing, thereby preventing the bumps of the semiconductor chip from shorting each other with electrically conductive particles connected in series between the bumps. Furthermore, the amount of anisotropic conductive film clinging to the sides of the semiconductor chip is reduced to a minimum required amount.

In an anisotropic conductive film in accordance with a fifth exemplary embodiment of the present invention, the first layer is fabricated of a material having a low fluidity.

The anisotropic conductive film in accordance with the above exemplary embodiment reliably controls an excess flow of electrically conductive particles.

In an anisotropic conductive film in accordance with a sixth exemplary embodiment of the present invention, the highly fluid material has a lower density of the electrically conductive particles than the less fluid material.

In the anisotropic conductive film in accordance with the above exemplary embodiment, the highly fluid material also contributes to electrical connection between the semiconductor chip and the substrate, thereby assuring electrical connection.

In an anisotropic conductive film in accordance with a seventh exemplary embodiment of the present invention, a band-like body having a fluidity lower than the fluidity of the second layer is arranged on the periphery of at least one of the first layer and the second layer.

In the anisotropic conductive film in accordance with the above exemplary embodiment, the band-like body restricts an excess flow of the second layer, thereby preventing an excessively large fillet from being produced.

A circuit board in accordance with an eighth exemplary embodiment of the present invention includes a semiconductor chip and a substrate with an anisotropic conductive film according to one in accordance with one of the above exemplary embodiments interposed therebetween.

The circuit board in accordance with the above exemplary embodiment prevents the anisotropic conductive film from excessively flowing out into the periphery around the semiconductor chip and clinging to the remaining area of the circuit board when the semiconductor chip is thermocompression bonded. The semiconductor chip is reliably connected, forming a reliable circuit board.

Electronic equipment in accordance with the ninth exemplary embodiment of the present invention includes a circuit board according in accordance with the eight exemplary embodiment.

Since the electronic equipment in accordance with the above exemplary embodiment includes a highly reliable circuit board with the semiconductor chip mounted, the electronic equipment itself becomes reliable.

A semiconductor device in accordance with the tenth exemplary embodiment of the present invention includes a substrate on which a semiconductor chip is mounted through an anisotropic conductive film, wherein the anisotropic conductive film is fabricated by laminating a first layer including at least one layer structure having electrically conductive particles, and a second layer including at least one layer structure having a fluidity higher than the fluidity of the first layer.

When heated, the semiconductor device in accordance with the above exemplary embodiment creates a different fluidity between the first layer and the second layer. With the first layer less fluid and thus higher in hardness, the anisotropic conductive film is prevented from flowing out from between the semiconductor chip and the substrate when the semiconductor chip is bonded to the substrate by thermo-compression. The number of electrically conductive particles between the electrodes of the semiconductor chip and the electrodes of the substrate is thus increased. On the other hand, with the second layer being more fluid and softer than the first layer, the anisotropic conductive film easily flows outward from between the semiconductor chip and the substrate when the semiconductor chip is bonded by thermo-compression to the substrate. This arrangement forms the fillet clinging to the sides of the semiconductor chip without impeding the contact between the chip electrodes and the substrate electrodes.

In a semiconductor device in accordance with the eleventh exemplary embodiment of the present invention, the second layer is formed over first layer.

In the semiconductor device in accordance with the above exemplary embodiment, the second layer achieves two purposes of assuring the mechanical bond and the electrical connection of the semiconductor chip to the substrate, when the semiconductor chip is thermo-compression bonded to the substrate. Specifically, the second layer fills the space surrounding the active-element formation surface of the semiconductor chip while forming the fillet on the sides of the semiconductor chip for enhancing the bond of the semiconductor chip, and interposes the electrically conductive particles between the semiconductor chip and the substrate for assuring the electrical connection therebetween.

As for materials, the above-referenced substrate may be an organic-material based substrate such as a plastic substrate or a flexible substrate, or an inorganic-material based substrate such as a ceramic substrate.

BRIEF DESCRIPTION OF THE DRAWINGS

FIGS. 8(A) and 8(B) are cross-sectional views showing a semiconductor chip in a mounted state using a conventional anisotropic conductive film, wherein FIG. 8(A) is the cross-sectional view showing the semiconductor chip thermo-compression mounted using the conventional anisotropic conductive film and FIG. 8(B) is the cross-sectional view showing the semiconductor chip mounted on a warped substrate using the conventional anisotropic conductive film.

DETAILED DESCRIPTION OF THE EMBODIMENTS

Figure 1:
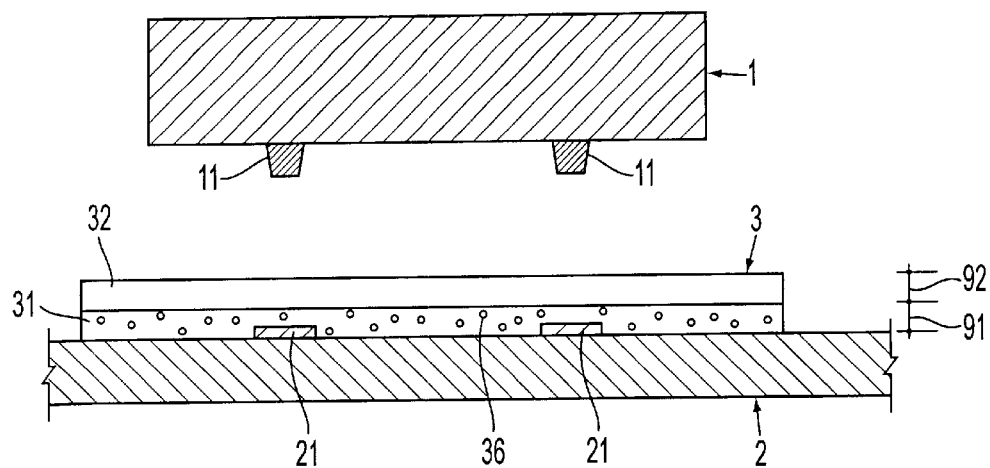
FIG. 1 is a cross-sectional view showing the construction of an anisotropic conductive film, interposed between a substrate and a semiconductor chip, of a first embodiment of the present invention.

The preferred embodiments of the present invention are now discussed, referring to the drawings.

Figure 2:
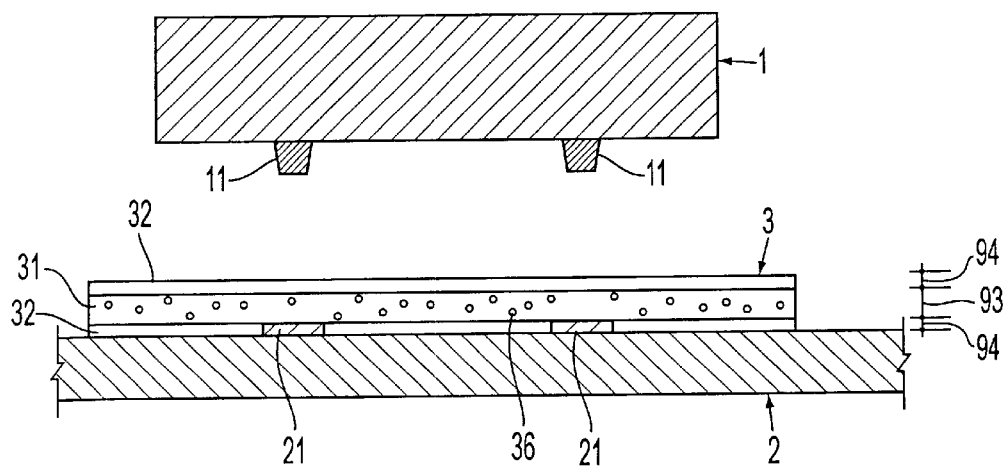
FIG. 2 is a cross-sectional view showing the construction of an anisotropic conductive film, interposed between a substrate and a semiconductor chip, of a second embodiment of the present invention.
Figure 3:
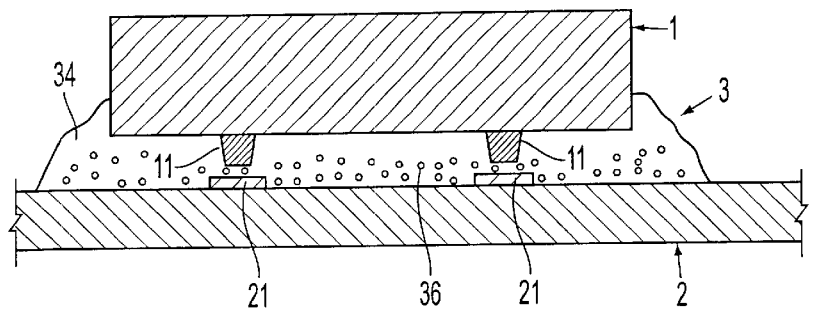
FIG. 3 is a cross-sectional view showing a semiconductor chip that is mounted using the anisotropic conductive film of the first embodiment of the present invention.
Figure 4A:
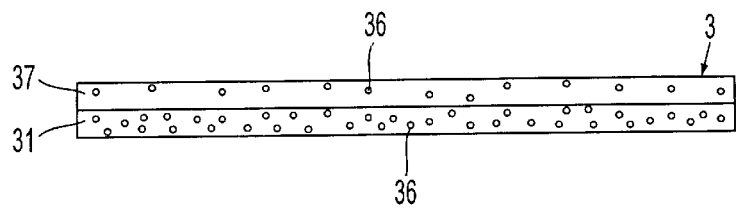
FIGS. 4(A) to 4(C) are cross-sectional views showing the anisotropic conductive film of each of the first and second embodiments of the present invention, wherein a layer containing electrically conductive particles at a low density is substituted for an electrically non-conductive layer.
Figure 4B:
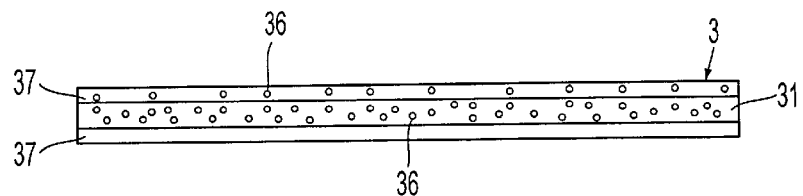
Figure 4C:
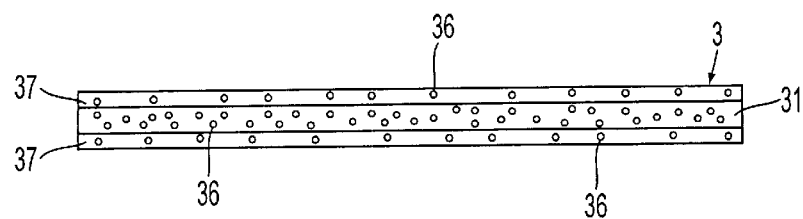
Figure 5A:
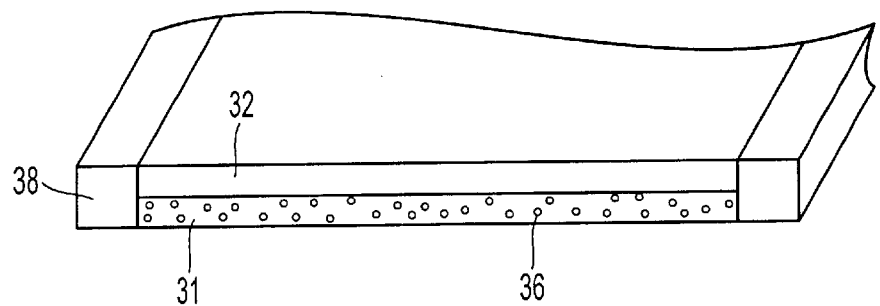
FIGS. 5(A) to 5(C) are perspective views showing a modification of the anisotropic conductive film of the first embodiment of the present invention.
Figure 5B:
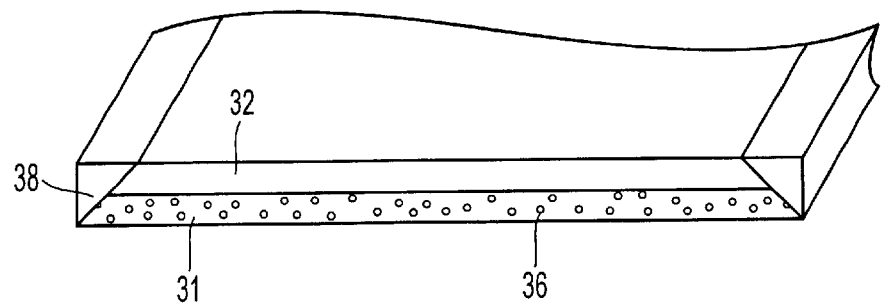
Figure 5C:
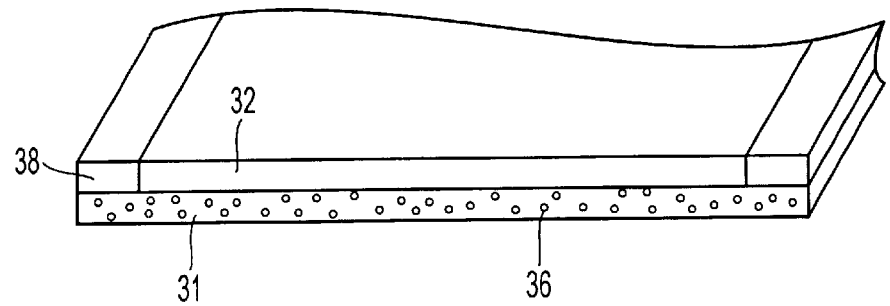
Figure 6A:
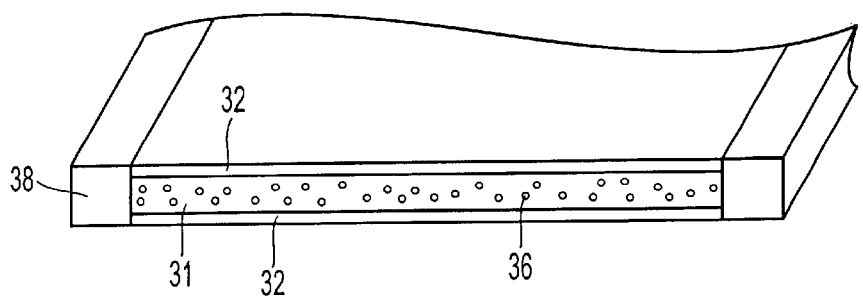
FIGS. 6(A) to 6(C) are perspective views showing a modification of the anisotropic conductive film of the second embodiment of the present invention.
Figure 6B:
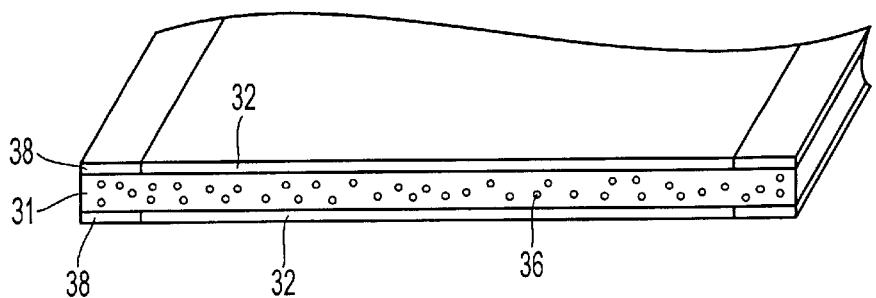
Figure 6C:
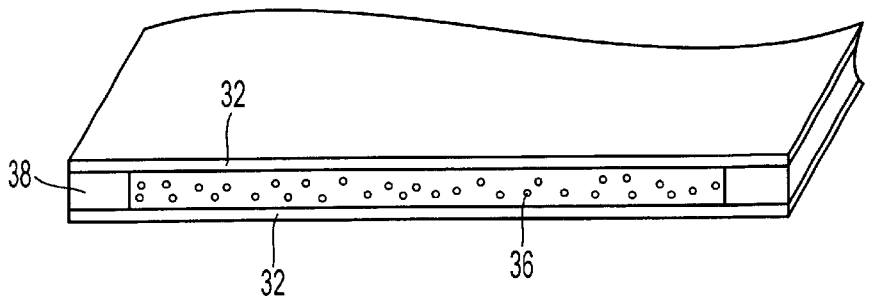
Figure 7:
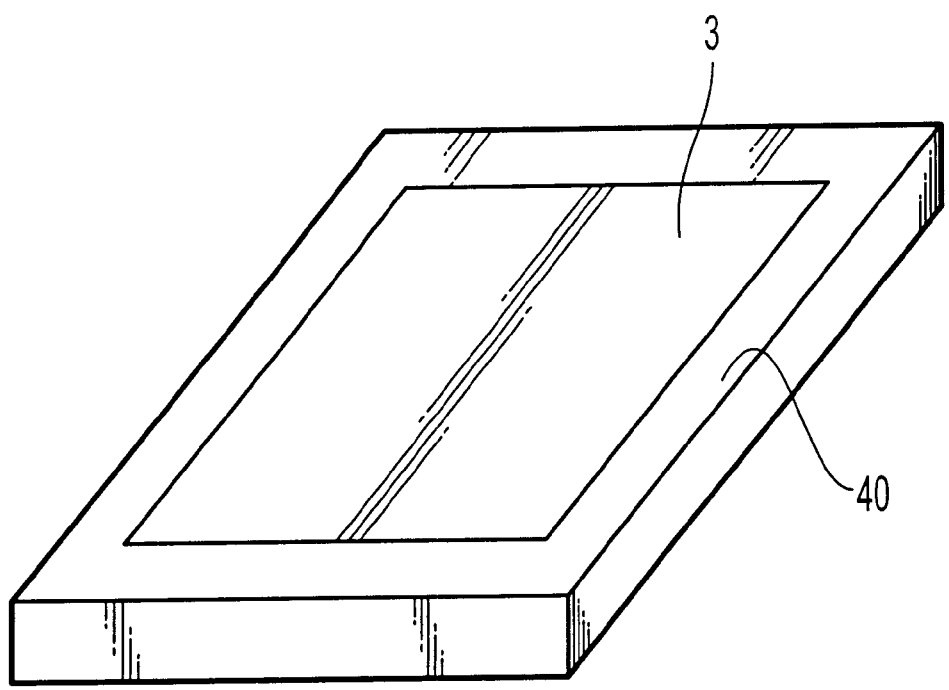
FIG. 7 is a perspective view showing the anisotropic conductive film of each of the first and second embodiments of the present invention, wherein a band-like body is structured in a frame configuration.
Figure 9:
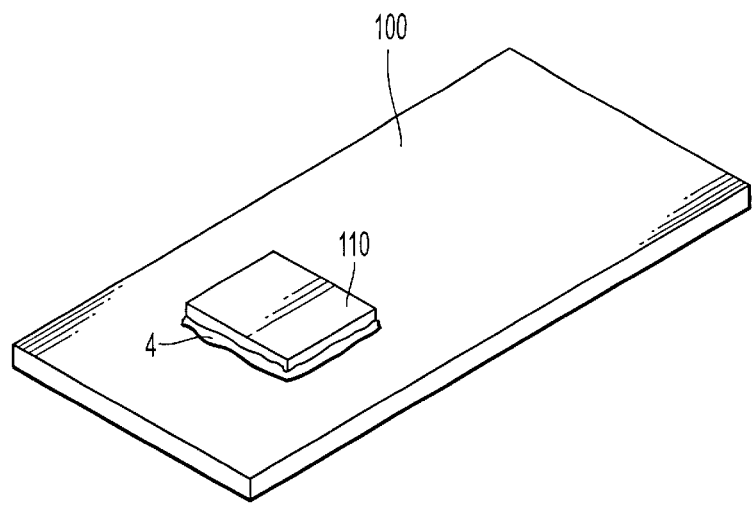
FIG. 9 is a diagram explaining a circuit board on which a semiconductor chip is mounted using the anisotropic conductive film of one of the above embodiments of the present invention.
Figure 10:
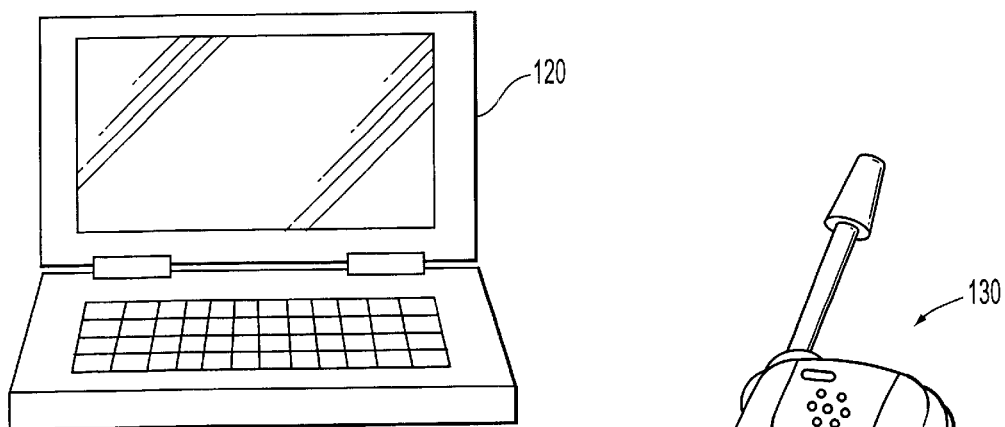
FIG. 10 is a view showing a note-book type personal computer of one embodiment of the present invention.
Figure 11:
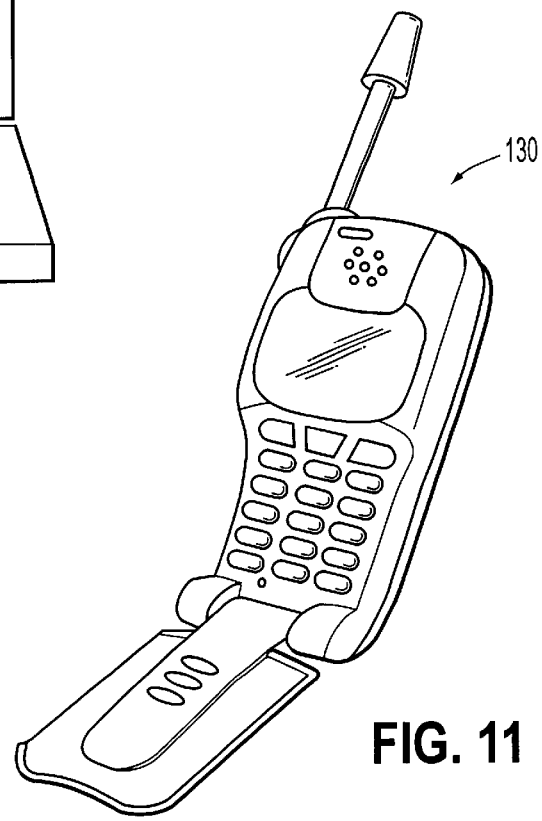
FIG. 11 is a view showing a portable telephone of one embodiment of the present invention.

FIG. 1 is a cross-sectional view showing the construction of an anisotropic conductive film, interposed between a substrate and a semiconductor chip, of a first embodiment of the present invention. FIG. 2 is a cross-sectional view showing the construction of an anisotropic conductive film, interposed between a substrate and a semiconductor chip, of a second embodiment of the present invention. FIG. 3 is a cross-sectional view showing a semiconductor chip that is mounted using the anisotropic conductive film of the first embodiment of the present invention. FIGS. 4(A) to 4(C) are cross-sectional views showing the anisotropic conductive film of each of the first and second embodiments of the present invention, wherein a layer containing electrically conductive particles at a low density is substituted for an electrically non-conductive layer. FIGS. 5(A) to 5(C) are perspective views showing a modification of the anisotropic conductive film of the first embodiment of the present invention. FIGS. 6(A) to 6(C) are perspective views showing a modification of the anisotropic conductive film of the second embodiment of the present invention. FIG. 7 is a perspective view showing the anisotropic conductive film of each of the first and second embodiments of the present invention, wherein a band-like body is structured in a frame configuration. FIG. 9 is a diagram explaining a circuit board on which a semiconductor chip is mounted using the anisotropic conductive film of one of the above embodiments of the present invention. FIG. 10 is a view showing a note-book type personal computer of one embodiment of the present invention. FIG. 11 is a view showing a portable telephone of one embodiment of the present invention.

Referring to FIG. 1, an anisotropic conductive film 3 of the first embodiment of the present invention is produced by laminating, into a unitary body, an electrically conductive particle containing layer 31 constructed of a mixture of a resin and electrically conductive particles 36, and an electrically non-conductive layer 32 containing no electrically conductive particles 36 and constructed of a resin having a fluidity higher than that of the electrically conductive particle containing layer 31. The anisotropic conductive film 3 is almost identical to the conventional anisotropic conductive film in overall thickness.

The electrically conductive particle containing layer 31 is fabricated of the resin having a high molecular weight. Since the electrically conductive particle containing layer 31 is high in hardness and has a fluidity lower than that of the electrically non-conductive layer 32, the electrically conductive particle containing layer 31 is thus maintained in a relatively low fluidity state, even when heated. When a pressure is applied onto the semiconductor chip 1, the electrically conductive particle containing layer 31 is less likely to be pushed out from between the semiconductor chip 1 and the substrate 2, thereby with less clinging to the sides of the semiconductor chip 1. Fabricated of the resin having a low molecular weight, the electrically non-conductive layer 32 is soft and has a higher fluidity than that of the electrically conductive particle containing layer 31. When heated, the electrically non-conductive layer 32 well flows in the gap between the semiconductor chip 1 and the substrate 2.

The anisotropic conductive film 3 is placed with the electrically conductive particle containing layer 31 facing to the substrate 2 and the electrically non-conductive layer 32 facing to the semiconductor chip 1. When the semiconductor chip 1 is bonded to the substrate 2 by thermo-compression, the electrically conductive particle containing layer 31 fills the space surrounding the bumps 11 of the semiconductor chip 1 while being bonded to the active-element formation surface of the semiconductor chip 1. At the same time, the anisotropic conductive film 3 forms a fillet on the sides of the semiconductor chip 1, reinforcing the bond of the semiconductor chip. The electrically conductive particle containing layer 31 ensures the electrical connection between the semiconductor chip 1 and the substrate 2 by leaving electrically conductive particles 36 interposed therebetween.

The operation of the anisotropic conductive film 3 is further discussed. When the semiconductor chip 1 is thermo-compression bonded to the substrate 2, the anisotropic conductive film 3 is clamped between the bumps 11 formed in electrode pads not shown of the semiconductor chip 1 and a wiring pattern 21 of the substrate 2. Since the resin constructing the electrically conductive particle containing layer 31 is hard, the resin is partly left between the bumps 11 and the wiring pattern 21. Electrically conductive particles 36 mixed in the electrically conductive particle containing layer 31 do not flow from between the bumps 11 and the wiring pattern 21 even after the thermo-compression operation. The electrical connection between the semiconductor chip 1 and the substrate 2 is thus reliably established.

The electrically non-conductive layer 32 is more fluid and softer than the electrically conductive particle containing layer 31, and flows in the gap between the semiconductor chip 1 and the substrate 2. The electrically non-conductive layer 32 thus flows along the irregularities of the bonding surfaces of the semiconductor chip 1 and the substrate 2 and the warp of the substrate 2, and fills the gap therebetween, thereby enhancing the bond between the anisotropic conductive film 3 and the semiconductor chip 1 and between the anisotropic conductive film 3 and the substrate 2. The electrically non-conductive layer 32 flows out from between the semiconductor chip and the substrate, and forms a fillet 34 shown in FIG. 3, thereby reinforcing the mechanical bond between the semiconductor chip 1 and the substrate 2. Since most of the resin clinging to the sides of the semiconductor chip 1 and forming the fillet 34 originates from that of the electrically non-conductive layer 31, the amount of the resin clinging to the sides is thus controlled.

The electrically conductive particle containing layer 31 is fabricated of epoxy-based resins. The composition of the resin is a mixture of a solid epoxy-based resin of 75 to 99 percent by weight and a liquid epoxy-based resin of 1 to 25 percent by weight.

The electrically non-conductive layer 32 is fabricated of epoxy-based resins. The composition of the resin is a mixture of a solid epoxy-based resin of 50 to 75 percent by weight and a liquid epoxy-based resin of 25 to 50 percent by weight.

To reduce the amount of the resin flowing out from between the semiconductor chip and the substrate and to assure a sufficient amount of electrically conductive particles 36 interposed between the bump 11 and the wiring pattern 21, the thickness 91 of the electrically conductive particle containing layer 31 is preferably larger than the thickness 92 of the electrically non-conductive layer 32. In view of the properties of the two layers, the thickness 92 of the electrically non-conductive layer 32 is preferably slightly larger than the thickness 91 of the electrically conductive particle containing layer 31. For instance, the thickness 91 of the electrically conductive particle containing layer 31 is 40% of the overall thickness of the anisotropic conductive film 3, and the thickness 92 of the electrically non-conductive layer 32 is 60% of the overall thickness of the anisotropic conductive film 3, and more specifically, the thickness 91 and the thickness 92 are respectively preferably to be approximately 20 mm and 30 mm.

The property of the anisotropic conductive film 3 (to be harder or softer, for instance) by adjusting the thicknesses of the two layers in accordance with conditions such as the thickness of the semiconductor chip 1, the area of the anisotropic conductive film equal to the area of the semiconductor chip 1 bearing the bumps 11, and so on.

As discussed above, the anisotropic conductive film 3 of the first embodiment of the present invention has a two-layer structure, constructed of the harder, electrically conductive particle containing layer 31 and the electrically non-conductive layer 32 softer than the electrically conductive particle containing layer 31. The electrically conductive particles are thus prevented from flowing out from between the semiconductor chip and the substrate. From among the conventional anisotropic conductive films, some are entirely constructed of a soft resin. Compared to these conventional anisotropic conductive films, the soft layer (the electrically non-conductive layer 32) is thin, and the amount of the resin flowing out from between the semiconductor chip and the substrate is reduced. This arrangement also reduces the amount of the anisotropic conductive film clinging to the thermo-compression tool. Compared to anisotropic conductive films entirely constructed of a hard resin, the electrically non-conductive layer 32 is high in fluidity, and easily flows in the gap between the semiconductor chip 1 and the substrate 2, thereby filling the gap. The bond between the semiconductor chip 1 and the substrate 2 is well secured.

Compared to the conventional anisotropic conductive films entirely constructed of a soft resin, the conventional, electrically conductive film constructed of a hard resin is subject to an electrical connection failure between the bump 11 and the wiring pattern 21, with the hard resin clamped between the bump 11 and the wiring pattern 21. In contrast, the present embodiment has a layer which is thinner than the one in the conventional film to reliably assure the electrical connection with the hard layer (the electrically conductive particle containing layer 31). Even if the electrically conductive particles 36 are constructed of metal particles, the surface of the bumps 11 of the semiconductor chip 1 is free from direct contact with the electrically conductive particle containing layer 31, and the electrically conductive particles 36 will not damage the surface of the bumps 11 of the semiconductor chip 1. Since the anisotropic conductive film 3 is constructed of two types of resins having different properties, the anisotropic conductive film 3 has both the hard and soft properties, and is free from the drawbacks of the conventional anisotropicy conductive film.

The mounting procedure of mounting the semiconductor chip to substrate using the anisotropic conductive film of the first embodiment of the present invention is now discussed. The semiconductor chip 1 is glued to cover the wiring pattern 21 of the substrate 2 for connection with the electrically conductive particle containing layer 31 facing the substrate 2 and the electrically non-conductive layer 32 facing the semiconductor chip 1. With the bumps facing the wiring pattern 21, the semiconductor chip 1 is placed on the anisotropic conductive film 3.

Figure 8A:
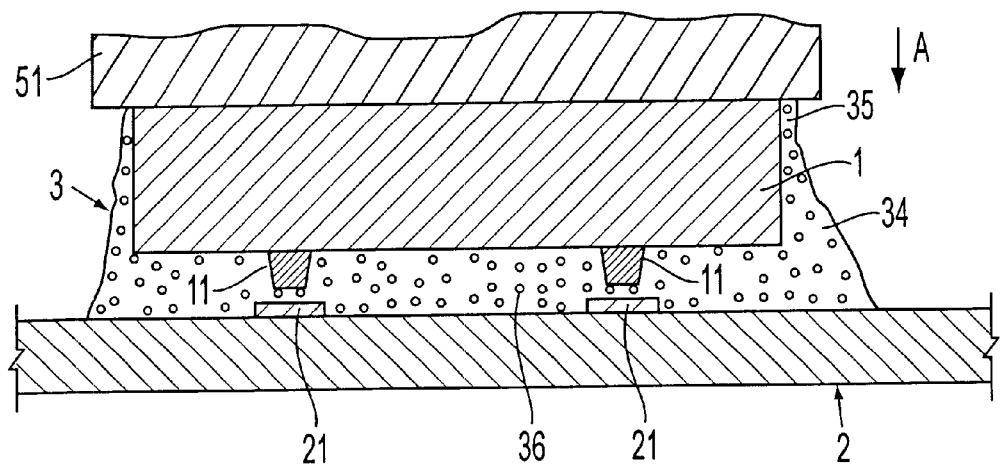
Figure 8B:
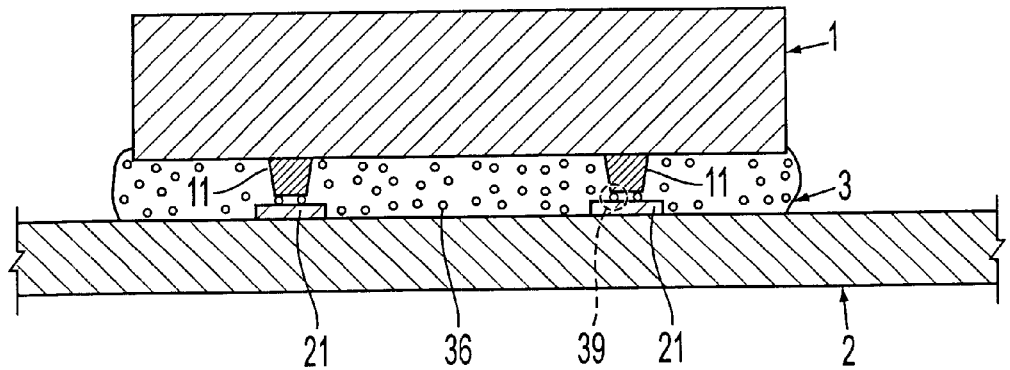

Using the thermo-compression tool 51 shown in FIG. 8(A), the semiconductor chip 1 is heated from the back side thereof at a temperature within a range from 180° C. to 200° C. while being pressed. As already discussed, the electrically conductive particle containing layer 31 stays between the semiconductor chip 1 and the substrate 2 without flowing too much. The electrically non-conductive layer 32 flows and is bonded to the semiconductor chip 1 and the substrate 2, and flows out from between the semiconductor chip 1 and the substrate 2, and clings to the sides of the semiconductor chip 1.

When the semiconductor chip 1 is bonded by thermo-compression, the anisotropic conductive film 3 sets, leaving a sufficient number of electrically conductive particles between the bump 11 and the wiring pattern 21 as shown in FIG. 3. Formed on the sides of the semiconductor chip 1 is the fillet 34 sized to be free from clinging to the thermo-compression tool 51.

The first embodiment of the present invention may also be constructed as discussed below to maintain the fluidity of the electrically non-conductive layer 32 at a high level while preventing the electrically non-conductive layer 32 from excessively clinging to the semiconductor chip. Referring to FIG. 5(A), band-like bodies 38 may be arranged on both sides of the electrically conductive particle containing layer 31 and the electrically non-conductive layer 32. The band-like bodies 38 are formed of a resin as hard as or harder than the electrically conductive particle containing layer 31. When the semiconductor chip 1 is bonded by thermo-compression, the band-like bodies 38 arranged on both sides of the electrically non-conductive layer 32 controls the flow of the electrically non-conductive layer 32. Even if the fluidity of the electrically non-conductive layer 32 is high, the electrically non-conductive layer 32 does not excessively cling to the sides of the semiconductor chip 1.

When the band-like bodies 38 are employed, the width of the electrically conductive particle containing layer 31 and the electrically non-conductive layer 32 is preferably equal to the width of the semiconductor chip to be mounted. With this arrangement, when the semiconductor chip 1 is bonded by thermo-compression, the band-like bodies 38 serve the purpose of enclosing the gap between the semiconductor chip and the substrate, thereby controlling the electrically non-conductive layer 32 from flowing out from the gap between the semiconductor chip and the substrate.

The configuration of the band-like bodies 38 is not limited to the one shown in FIG. 5(A). As long as they control the flow of the electrically non-conductive layer 32, any configuration of the band-like bodies 38 is acceptable. For instance, the band-like bodies 38 configured as shown in FIG. 5(B) or FIG. 5(C) also work. As shown in FIG. 7, a frame 40 may be substituted for the band-like bodies. The anisotropic conductive film 3 is formed within the frame 40.

The anisotropic conductive film of a second embodiment of the present invention is now discussed. Referring to FIG. 2, two electrically non-conductive layers 32 are employed for the anisotropic conductive film 3 in this embodiment. As shown, the two electrically non-conductive layers 32 are laminated with the electrically conductive particle containing layer 31 interposed therebetween. The materials of the electrically conductive particle containing layer 31 and the electrically non-conductive layer 32 remain unchanged from those in the first embodiment.

This embodiment is more complex than the first embodiment in construction. However, since the semiconductor chip 1 is bonded by thermo-compression with the electrically non-conductive layers 32 respectively in contact with the surface of the semiconductor chip 1 having the bump 1 and the surface of the substrate 2 having the wiring pattern 21, the electrically non-conductive layer 32 flows along the irregularity of the substrate 2. Compared to the preceding embodiment in which the hard, electrically conductive particle containing layer 31 is in contact with the substrate 2, the anisotropic conductive film 3 is well bonded to the substrate 2. Since the semiconductor chip 1 is securely bonded to the substrate 2, the reliability of the connection therebetween is increased.

Now, let 93 represent the thickness of the electrically conductive particle containing layer 31 and let 94 represent the thickness of the electrically non-conductive layer 32 in this embodiment. In view of the properties of the electrically conductive particle containing layer 31 and the electrically non-conductive layer 32, the thickness 94 of the electrically non-conductive layer 32 is preferably slightly larger than the thickness 93 of the electrically conductive particle containing layer 31. Specifically, the thickness 93 of the electrically conductive particle containing layer 31 is preferably 40% of the overall thickness of the anisotropic conductive film 3, and the thickness 94 of the electrically non-conductive layer 32 is preferably 60% of the overall thickness of the anisotropic conductive film 3. More specifically, the thickness 93 of the electrically conductive particle containing layer 31 is preferably 20 mm or so, and the thickness 94 of the electrically non-conductive layer 32 (one layer) is preferably 15 mm or so (thus, a total thickness of 30 mm or so for the two electrically non-conductive layers 32).

As in the first embodiment of the present invention, the band-like bodies 38 may be arranged on both sides of the electrically conductive particle containing layer 31 and the electrically non-conductive layer 32 as shown in FIGS. 6(A), 6(B), and 6(C).

In each of the preceding embodiments, the area of the anisotropic conductive film 3 is preferably equal to or slightly wider than the area of the active-element formation surface of the semiconductor chip 1. With this arrangement, the mounting of the semiconductor chip 1 is not affected by a slip, if the magnitude of the slip is small, of the mounting position of the anisotropic conductive film 3. As a result, the accuracy of the mounting position of the anisotropic conductive film 3 is not so critical, and the management of the bonding steps of the anisotropic conductive film 3 becomes easy. Since the area of the anisotropic conductive film 3 is not large, no large fillets are formed on the periphery of the semiconductor chip 1.

In the anisotropic conductive film 3 of each of the above embodiments, only the electrically conductive particle containing layer 31 contributes to the electrical connection between the semiconductor chip 1 and the substrate 2. Alternatively, a low-density, electrically conductive particle containing layer 37 may be substituted for the electrically non-conductive layer 32 as shown in FIGS. 4(A), 4(B), and 4(C). The low-density, electrically conductive particle containing layer 37 contains the electrically conductive particles at a lower density than the electrically conductive particle containing layer 31, and is constructed of the same resin as that of the electrically non-conductive layer 32. With this arrangement, electrically conductive particles contained in the low-density, electrically conductive particle containing layer 37 contribute to the electrical connection between the semiconductor chip and the substrate. The density of the electrically conductive particles contained in the low-density, electrically conductive particle containing layer 37 is preferably within a range that permits no shorts between the bumps 11 of the semiconductor chip.

In each of the above embodiments, the electrically conductive particles mixed into the anisotropic conductive adhesive agent may be metallic particles or metal-coated resin particles. The material and the configuration thereof are not important. The bumps may be formed on the electrodes of the substrate rather than on the electrodes of the semiconductor chip.

In each of the above embodiments, the semiconductor chip has electrodes arranged on all of the four sides thereof. The present invention is not limited to this. Alternatively, the electrodes may be arranged on two sides only, or may be arranged on the entire surface of the semiconductor chip.

The electrodes may be laid out in any configuration, for instance, entirely or in part along the periphery of the active-element formation surface, or on the entire active-element formation surface.

The anisotropic conductive film of each of the above embodiments may serve a purpose other than the connection between the semiconductor chip and the substrate.

In accordance with the embodiments of the present invention, the thermo-compression tool is free from the deposit of the anisotropic conductive film when the semiconductor chip is thermo-compression bonded to the substrate. Since the fillet having an appropriate size is formed on the sides of the semiconductor chip, the mechanical bond between the semiconductor chip and the substrate is increased. In addition, the electrical connection between the substrate and the semiconductor chip is assured, because a sufficient number of electrically conductive particles is present between the electrodes of the semiconductor chip and the electrodes of the substrate.

FIG. 9 shows another example of the semiconductor chip that is mounted using the above-referenced anisotropic conductive film. Specifically, FIG. 9 shows a circuit board 100 on which a semiconductor chip 110 is mounted using an anisotropic conductive film 4 of one of the embodiments of the present invention. The circuit board 100 is typically an organic board such as an epoxy glass board. A bonding portion, constructed of copper, for instance, is formed to be in a desired circuit on the circuit board 100. By mechanically connecting the bonding portion and the external electrodes of the semiconductor chip 110, the electrical connection is assured therebetween.

The mounting area of the semiconductor chip 110 is reduced sufficient enough to allow itself to be mounted on a bare chip. With the circuit board 100 incorporated in electronic equipment, the electronic equipment itself is reduced in size. In the same plane, more mounting space is allowed, providing space for more functions.

As the electronic equipment having the circuit board 100, FIG. 10 shows a notebook-type personal computer 120, and FIG. 11 shows a portable telephone 130.

Industrial Applicability

As discussed above, the anisotropic conductive film, which bonds the semiconductor chip to the substrate while serving as the electrically conductive medium between the semiconductor chip and the substrate, includes the first layer including at least one layer structure having electrically conductive particles, and the second layer including at least one layer structure having a fluidity higher than the fluidity of the first layer. The second layer well flows and fills the space surrounding the active-element formation surface of the semiconductor chip, thereby increasing the bond between the semiconductor chip and the substrate. Since the first layer has a fluidity relatively lower than that of the second layer, electrically conductive particles remain between the electrodes of the semiconductor chip and the electrodes of the substrate, thereby enhancing the reliability of the electrical connection therebetween. The reliability of the semiconductor device using the anisotropic conductive film is consequently increased.

What is claimed is:

1. An anisotropic conductive film which bonds a semiconductor chip to a substrate while serving as an electrically conductive medium between the semiconductor chip and the substrate, the anisotropic conductive film comprising:

a first layer comprising at least one layer structure of electrically conductive particles; and a second layer comprising at least two layer structures having a fluidity higher than the fluidity of the first layer, the first layer interposed between at least the two layer structures.

2. The anisotropic conductive film according to claim 1, the first layer being thicker than the second layer.

3. The anisotropic conductive film according to claim 1, the first layer being fabricated of a material having a low fluidity.

4. The anisotropic conductive film according to claim 1, the second layer the electrically conductive particles at a density lower than the first layer.

5. The anisotropic conductive film according to claim 1, further comprising a band-like body having a fluidity lower than the fluidity of the second layer arranged on a periphery of at least one of the first layer and the second layer.

6. A circuit board, comprising:

a semiconductor chip;

a substrate; and an anisotropic conductive film according to claim 3 interposed between the semiconductor chip and substrate.

7. Electronic equipment comprising a circuit board according to claim 6.

8. A semiconductor device, comprising:

a substrate;

a semiconductor chip mounted on the substrate; and an anisotropic conductive film for mounting the semiconductor chip, the anisotropic conductive film being fabricated by laminating a first layer comprising at least one layer structure of electrically conductive particles, and a second layer comprising at least one layer structure having a fluidity higher than the fluidity of the first layer, wherein the first layer is interposed between at least the two second layer structures.

9. The semiconductor device according to claim 8, the first layer being thicker than the second layer.

10. The semiconductor device, according to claim 8, the first layer being fabricated of a material having a low fluidity.

11. The semiconductor device according to claim 8, the second layer the electrically conductive particles at a density lower than the first layer.

12. The semiconductor device according to claim 8, further comprising a band-like body having a fluidity lower than the fluidity of the second layer arranged on a periphery of at least one of the first layer and the second layer.

* * * * *

UNITED STATES PATENT AND TRADEMARK OFFICE
CERTIFICATE OF CORRECTION

PATENT NO.    : 6,426,566 B1  
DATED         : July 30, 2002  
INVENTOR(S)   : Toshihiro Sawamoto It is certified that error appears in the above-identified patent and that said Letters Patent is hereby corrected as shown below:

<u>Title page,</u>
Item [54], change title from:
"ANISOTROPIC CONDUCTOR FILM, SEMICONDUCTOR CHIP, AND METHOD OF PACKAGING"
to:
-- ANISOTROPIC CONDUCTIVE FILM, METHOD FOR MOUNTING SEMICONDUCTOR CHIP AND SEMICONDUCTOR DEVICE --

Signed and Sealed this

Seventeenth Day of December, 2002

JAMES E. ROGAN
*Director of the United States Patent and Trademark Office*